(12) United States Patent
Wu et al.

(10) Patent No.: US 11,892,490 B2
(45) Date of Patent: Feb. 6, 2024

(54) SYSTEM FOR MEASURING A MICROWAVE DIELECTRIC PROPERTY OF A SOLID MATERIAL UNDER FORCE

(71) Applicant: CENTRAL SOUTH UNIVERSITY, Hunan (CN)

(72) Inventors: Lixin Wu, Hunan (CN); Wenfei Mao, Hunan (CN); Yuan Qi, Hunan (CN)

(73) Assignee: CENTRAL SOUTH UNIVERSITY, Changsha (CN)

( * ) Notice: Subject to any disclaimer, the term of this patent is extended or adjusted under 35 U.S.C. 154(b) by 430 days.

(21) Appl. No.: 17/147,230

(22) Filed: Jan. 12, 2021

(65) Prior Publication Data

US 2021/0132130 A1   May 6, 2021

Related U.S. Application Data

(63) Continuation of application No. PCT/CN2019/114394, filed on Oct. 30, 2019.

(30) Foreign Application Priority Data

Mar. 8, 2019  (CN) .......................... 201910176614.8

(51) Int. Cl.
*G01R 27/26* (2006.01)
*G01N 3/06* (2006.01)
*G01N 3/12* (2006.01)
*G01N 22/00* (2006.01)

(52) U.S. Cl.
CPC ......... *G01R 27/2652* (2013.01); *G01N 3/066* (2013.01); *G01N 3/12* (2013.01); *G01N 22/00* (2013.01)

(58) Field of Classification Search
CPC .......... G01N 3/066; G01N 3/12; G01N 22/00; G01R 27/2652
See application file for complete search history.

(56) References Cited

U.S. PATENT DOCUMENTS

| | | | | |
|---|---|---|---|---|
| 4,996,489 A | * | 2/1991 | Sinclair ................ | G01R 27/267 324/639 |
| 7,791,355 B1 | * | 9/2010 | Esher .................. | G01R 29/0871 324/637 |
| 9,234,824 B1 | * | 1/2016 | Brovold ................... | G01N 3/08 |
| 9,551,686 B1 | * | 1/2017 | Griffith .................. | G01N 22/00 |
| 2013/0207680 A1 | * | 8/2013 | Garreau ............. | G01R 29/0821 324/750.23 |

(Continued)

FOREIGN PATENT DOCUMENTS

| | | |
|---|---|---|
| CN | 101034116 A | 9/2007 |
| CN | 102431235 A | 5/2012 |

(Continued)

*Primary Examiner* — Jeff W Natalini

(57) ABSTRACT

Disclosed herein is a system for measuring a microwave dielectric property of a solid material under force. The system measures the microwave dielectric property of the solid material under a horizontal pressure. A shield case for microwave electromagnetic shielding is provided outside the system. The shield case includes a layer of pure aluminum and a layer of pyramids made of a microwave absorbing material. A manual hydraulic pump controls loading and unloading of a pressure loading device.

5 Claims, 4 Drawing Sheets

(56) References Cited

U.S. PATENT DOCUMENTS

| | | | | |
|---|---|---|---|---|
| 2014/0126845 A1* | 5/2014 | Koike | ............... | F16C 27/00 |
| | | | | 384/99 |
| 2017/0010130 A1 | 1/2017 | Xu et al. | | |
| 2018/0128725 A1* | 5/2018 | Du | ............... | G01N 3/24 |
| 2019/0275775 A1* | 9/2019 | Liu | ............... | B32B 27/00 |
| 2019/0346378 A1* | 11/2019 | Alvarez | ............ | G01N 33/2823 |

FOREIGN PATENT DOCUMENTS

| | | |
|---|---|---|
| CN | 104407232 A | 3/2015 |
| CN | 109212320 A | 1/2019 |
| CN | 109342825 A | 2/2019 |
| CN | 109900969 A | 6/2019 |
| EP | 3428631 A2 | 1/2019 |

\* cited by examiner

SYSTEM FOR MEASURING A MICROWAVE DIELECTRIC PROPERTY OF A SOLID MATERIAL UNDER FORCE

CROSS-REFERENCE TO RELATED APPLICATIONS

This application is a continuation of International Patent Application No. PCT/CN2019/114394, filed on Oct. 30, 2019, which claims the benefit of priority from Chinese Patent Application No. 201910176614.8, filed on Mar. 8, 2019. The content of the aforementioned applications, including any intervening amendments thereto, is incorporated herein by reference in its entirety.

TECHNICAL FIELD

This disclosure relates to dielectric testing, and more particularly to a system for measuring a microwave dielectric property of a solid material under force.

BACKGROUND

Measurement of dielectric properties of materials has been promoted with the development of electronics, communications, radar and remote sensing. Different materials generally display different dielectric properties that are affected by the chemical composition and microstructure of the materials, and therefore, the dielectric property is one of the important parameters that characterize the inherent physical properties of materials. Methods such as a parallel plate method, a coaxial probe method, a transmission line method, a resonant cavity method, a free-space method are used to measure the dielectric properties of solid materials under various requirements. The parallel plate method is to obtain a dielectric constant of a material by measuring a capacitance of a capacitor consisting of two electrode plates. Though this method is simple and developed, it is only suitable for a flat thin solid material under a direct current or low frequency. The coaxial probe method obtains a complex dielectric constant of a material by putting an "edge" of an electric field of the metal probe tip into the material, and then calculating the reflected signal of the electric field. This method is used for measuring high-frequency complex dielectric constant of solid materials. Unfortunately, the gap between probe and sample and the sample thickness will lead to measurement inaccuracy. The transmission line method places the test material in a partially enclosed transmission line, and calculates the complex dielectric constant according to a reflection signal and a transmission signal in the transmission line. The shape and size of the material are required to match the internal structure of the transmission line, which increases the difficulty in sample preparation. In the resonant cavity method, a sample is placed in a cavity, and a complex dielectric constant of the sample at a certain frequency is calculated based on a disturbance of the sample to the resonance frequency and quality factor of the cavity. This method meets a need for testing samples with small sizes and low loss. The free-space method uses an antenna to focus microwave energy on or penetrates a thin or thick plate-shaped material, and calculates a dielectric constant by measuring the reflected and transmitted signals. However, this method is hard to calibrate the system, and the accuracy and system stability are less preferred compared with those of other test methods.

In recent years, with the development of microwave remote sensing technology, the microwave radiation of materials has been used to interpret physical properties of materials. Meanwhile, the microwave dielectric property of the material is an important factor affecting the microwave radiation characteristic. The chemical composition, microstructure, temperature and humidity need to been taken into consideration in the study of influence factors of microwave dielectric property of the material. For solid materials, such as crustal rock, materials for building materials mechanical components, they are generally subjected to additional stress from the outside and then produce a mechanical behavior such as deformation and cracking. Existing systems only measure the microwave dielectric properties of solid materials under a static condition without additional stress, so they are not able to measure the microwave dielectric properties under additional stress. Therefore, considering the effect of external force, measuring the microwave dielectric property of solid materials under different stress conditions becomes a key technique to study an influence of additional stress on the microwave radiation of materials.

Generally, the loading system for solid materials and the microwave dielectric test system are two independent testing systems. However, measuring the microwave dielectric property of the solid material under force requires a combination of the two testing systems.

Mechanical tests for the solid materials are usually based on the rigid vertical loading system. Generally, in a uniaxial compression experiment for the solid materials, the bulk solid materials are generally placed on a loading platform (the bottom of the materials is in contact with the loading platform), and then a vertical displacement of an upper loading end applies a pressure to the bulk solid materials. At this time, side surfaces of the bulk solid materials are free end surfaces on which tests for other physical parameters can be performed synchronously. Whereas in the microwave dielectric measurement of the solid materials, the transmission line method and traditional resonant cavity method need to place the test sample in a closed or semi-closed circumstance, and as a result the two methods are difficult to effectively integrate with the pressure loading system. It is impossible for the free-space method with undesired system stability and test accuracy to realize the effective microwave dielectric measurement of the solid materials under force. In the open coaxial probe method, the dielectric test probe is in contact with the sample and is easily disturbed during the loading process. In other words, the current loading system and microwave dielectric measuring system for the solid materials are hard to be combined to measure the microwave dielectric property of the solid material under force.

Based on the resonant cavity method, AET, Inc. (Japan) developed an open coaxial resonator microwave dielectric tester in 2006. This dielectric tester has certain characteristics compared to the traditional methods for measuring the dielectric property of the solid material. For example, the measurement using the open coaxial resonator is easy and convenient since the sample can be placed on the upper end of the test cavity in a simple manner. The test requirement can be met as long as in the sample preparation the solid material is designed to have a thickness greater than 0.5 mm and a circular flat surface with a diameter more than 1 cm. In addition, the sample is tightly attached to the test end of the open coaxial resonator because the open coaxial resonator testing system is provided with a vacuum device at the probe of the cavity.

SUMMARY

The existing systems can measure a microwave dielectric property of a solid material under a static condition, but an effect of additional stress has not been taken into account. However, the common microwave dielectric measuring system for the solid material and the loading system are hard to be combined to measure the microwave dielectric property of the solid material under force. In view of a microwave dielectric tester including an open coaxial resonator, the present disclosure provides a system for measuring a microwave dielectric property of a solid material under a uniaxial compression, which is suitable for the measurement and calibration of microwave dielectric changes of any bulk solid materials under force.

The present disclosure provides a system for measuring a microwave dielectric property of a solid material under force, wherein the system comprises:
- a microwave dielectric tester comprising on an open coaxial resonator;
- a pressure loading device;
- a shield case for microwave electromagnetic shielding;
- a spring seat; and
- a computer;
- wherein the microwave dielectric tester is connected to the spring seat; the pressure loading device is connected to the computer; the microwave dielectric tester and the pressure loading device are arranged inside the shield case;
- the pressure loading device is configured to load a horizontal pressure on a sample of the solid material; the microwave dielectric tester is configured to measure a dielectric constant and a dielectric loss of the sample under the horizontal pressure, and send measured the dielectric constant and the dielectric loss to the computer; the computer is configured to select a testing mode based on a test demand; the shield case is configured to shield an electromagnetic interference from an external environment; and the spring seat is configured to buffer the microwave dielectric tester against a compression caused by a deformation of the sample.

In some embodiments, the pressure loading device comprises:
- a plurality of rods configured for force transfer;
- a first rigid bearing plate; and
- a second rigid bearing plate;
- wherein the first rigid bearing plate and the second rigid bearing plate parallel to each other are vertically arranged; the plurality of rods spaced apart are arranged between the first rigid bearing plate and the second rigid bearing plate to form a frame structure together with the first rigid bearing plate and the second rigid bearing plate; a hydraulic cylinder is arranged at a side of the first rigid bearing plate facing the second rigid bearing plate; a pressure sensor is arranged at a side of the second bearing plate facing the first second bearing plate; the sample is held between the hydraulic cylinder and the pressure sensor; the hydraulic cylinder is configured to load a horizontal pressure on the sample; and the pressure sensor is configured to monitor a pressure on the sample.

In some embodiments, the hydraulic cylinder provides a loading force, and a type to the hydraulic cylinder is selected according to a requirement for a deformation of the sample, so as to provide a different maximum force.

In some embodiments, the pressure loading device further comprises a manual hydraulic pump configured to control loading and unloading of the pressure loading device via an oil pipe.

In some embodiments, the manual hydraulic pump controls a piston arranged at a front end of the hydraulic cylinder via the oil pipe, wherein during an oil-filling process, an oil pressure of the hydraulic cylinder is increased, and the piston is pushed out for pressurization; and during an oil-returning process, the oil pressure in the hydraulic cylinder is reduced, and the piston retracts inward for pressure reduction.

In some embodiments, the system further comprises a digital indicator configured to receive and display data sent by the pressure sensor, and the pressure sensor is connected to the computer through the digital indicator.

In some embodiments, the digital indicator is connected to the computer, so as to display, draw and save a pressure value in real time through a software of the computer.

In some embodiments, the shield case is a closed structure

In some embodiments, a through hole is provided at a bottom of a side of the shield case for the entrance and exit of a connecting wire.

In some embodiments, and the shield case comprises a layer of pure aluminum plate and a layer of pyramids made of a microwave absorbing material provided on an inner side of the layer of pure aluminum plate.

In some embodiments, the microwave absorbing material is polyurethane foam.

In some embodiments, the sample is of a block structure, preferably a cuboid.

In some embodiments, a microwave source generator provides a signal at a specific frequency for the open coaxial resonator.

In some embodiments, during a measurement, the sample is placed at an upper end of the open coaxial resonator.

In some embodiments, during a measurement, a bottom of the sample in contact with a detecting tip of the open coaxial resonator is a flat surface.

In some embodiments, a vacuum pump is provided to create a negative pressure between the sample and the upper end of the open coaxial resonator, so that the sample is in firm contact with the upper end of the open coaxial resonator.

The beneficial effects of the present disclosure are described as follows.

(1) A system for measuring a microwave dielectric property of a solid material under force is disclosed. In the system, a pressure loading device is configured to provide a horizontal pressure on a sample, and an open coaxial resonator can perform the microwave dielectric measurement on the bottom of the sample without being influenced, so that the microwave dielectric property of the sample under force can be measured.

(2) A microwave dielectric measuring system of solid materials and a mechanical loading system are effectively combined to detect microwave dielectric changes of the solid material in a breaking process under force. In addition, a shield case for microwave electromagnetic shielding with a microwave absorbing material is further provided to reduce an electromagnetic interruption from the system and an external environment, so that the stability of the system is improved and the measured result is more convincing.

The objects, technical solutions and beneficial effects of the present disclosure will be further described below with reference to the accompany drawings.

BRIEF DESCRIPTION OF THE DRAWINGS

This disclosure will be further described with reference to the accompanying drawings. The embodiments are illustrative, and not intended to limit the protection scope of the present disclosure.

Figure 1:
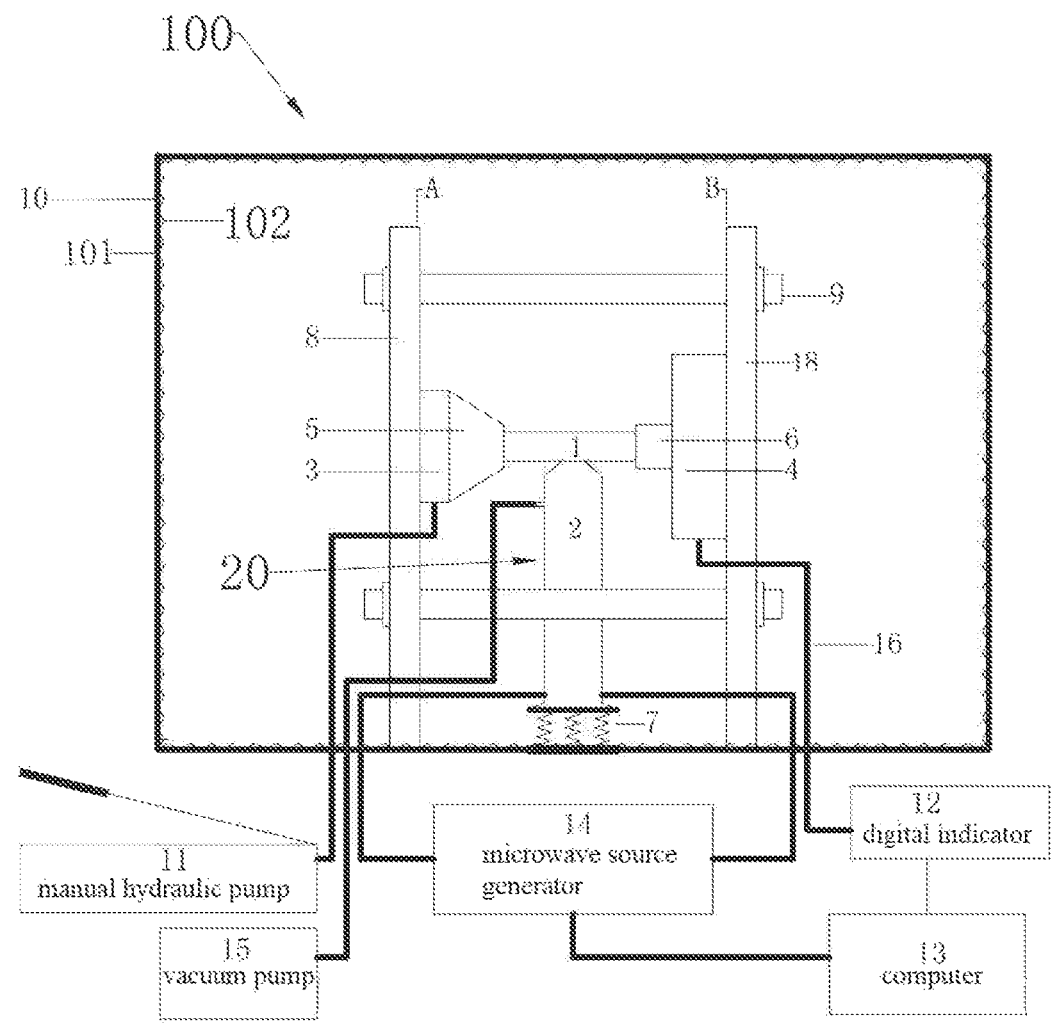
FIG. 1 depicts a system for measuring a microwave dielectric property of a solid material under force.

In the drawings: 100, system for measuring a microwave dielectric property of a solid material under force; 1, sample; 2, open coaxial resonator; 20, microwave dielectric tester; 3, hydraulic cylinder; 4, pressure sensor; 5, bearing block; 6, bearing block; 7, spring seat; 8, first rigid bearing plate; 9, rod; 10, shield case; 101, plate; 102, pyramid-shaped microwave absorbing material; 11, manual hydraulic pump; 12, digital indicator; 13, computer; 14, microwave source generator; 15, vacuum pump; 16, connecting wire; 17, pressure loading device; and 18, second rigid bearing plate.

DETAILED DESCRIPTION OF EMBODIMENTS

Figure 2:
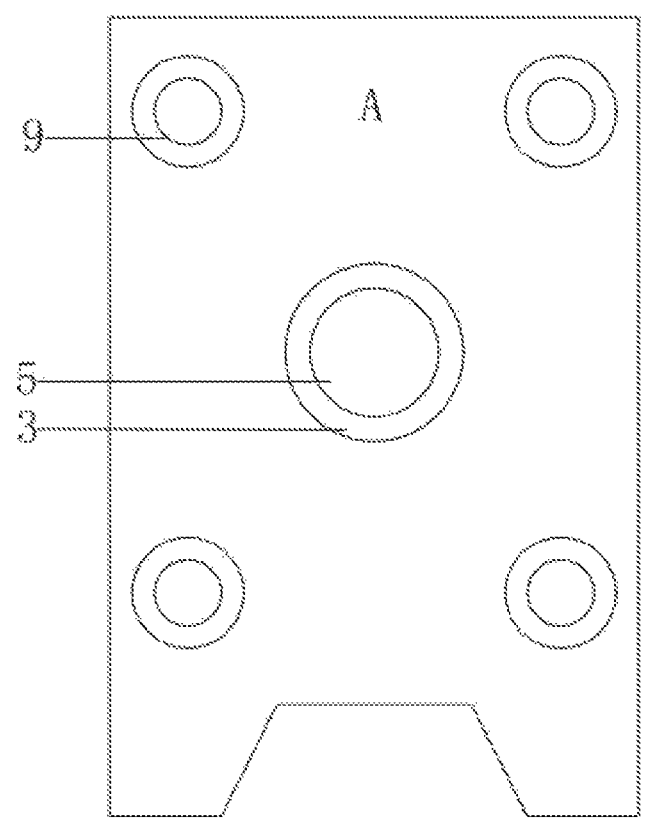
FIG. 2 is a close-up view of part A in FIG. 1.
Figure 3:
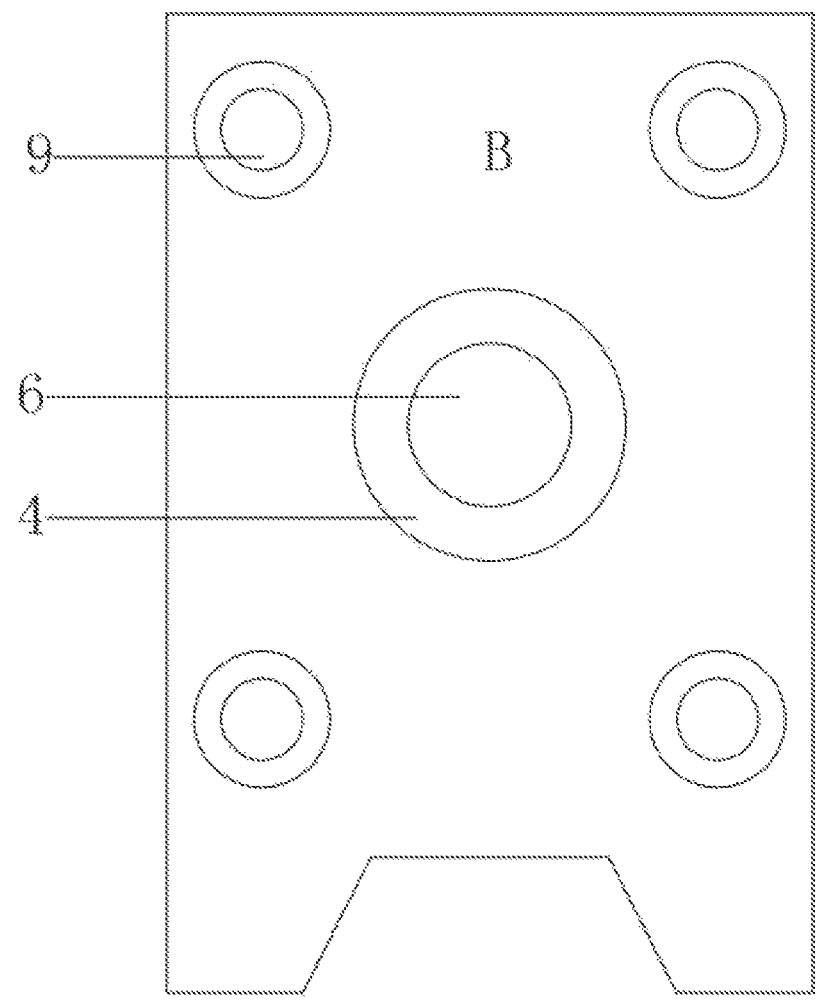
FIG. 3 is a close-up view of part B in FIG. 2.

As shown in FIGS. 1-3, a system for measuring a microwave dielectric property of a solid material under force 100 includes a microwave dielectric tester 20 including an open coaxial resonator 2 and a pressure loading device 17, and is equipped with an electromagnetic shielding function. A microwave dielectric test experiment and a loading experiment of a sample 1 of the solid material are effectively combined to measure a microwave dielectric property of the sample 1 under force.

The microwave dielectric tester 20 including the open coaxial resonator 2 is a recently developed instrument for measuring the microwave dielectric property of the solid material. The open coaxial resonator 2 of the microwave dielectric tester 20 has different types, and each type of the open coaxial resonator 2 can measure the dielectric constant of the sample 1 at specific frequencies. When using a certain type of open coaxial resonator 2 for measurement, an operator can use a software on a computer 13 to choose different testing modes, which includes a single-frequency testing mode and a multi-frequency testing mode. According to a requirement of the measurement, one or more frequencies in need are chosen in different testing modes. For example, the frequency is selected from the group consisting of 2 GHz, 6 GHz, 10 GHz, 14 GHz, 18 GHz and combinations thereof. The dielectric constant of the sample 1 is different in different testing mode. During the measurement, the sample 1 is placed at an upper end of the microwave dielectric tester 20. A microwave source generator 14 provides a signal at a specific frequency for the open coaxial resonator 2. An area of a bottom of the sample 1 in contact with a detecting tip of the microwave dielectric tester 20 is a flat surface. A vacuum pump 15 is provided to create a negative pressure between the sample 1 and the detecting tip, so that the sample 1 is in firm contact with the detecting tip. If the sample 1 is cuboid, faces of the sample 1 are free end faces except the bottom and a force can be loaded on the sample 1 during a microwave dielectric measurement.

The pressure loading device 17 is configured to provide a horizontal pressure on the sample 1, and the open coaxial resonator 2 can perform the microwave dielectric measurement on the bottom of the sample 1 without being influenced, so that the microwave dielectric property of the sample 1 under force can be measured. The pressure loading device 17 includes a plurality of rods 9 configured for force transfer, a first rigid bearing plate 8 and a second rigid bearing plate 18.

The first rigid bearing plate 8 and the second rigid bearing plate 18 parallel to each other are vertically arranged, and the plurality of rods 9 spaced apart are arranged between the first rigid bearing plate 8 and the second rigid bearing plate 18 to form a frame structure together with the first rigid bearing plate 8 and the second rigid bearing plate 18. A hydraulic cylinder 3 is arranged at a side of the first rigid bearing plate 8 facing the second rigid bearing plate 18, and a pressure sensor 4 is arranged at a side of the second bearing plate 18 facing the first second bearing plate 8. The sample 1 is held between the hydraulic cylinder 3 and the pressure sensor 4. The hydraulic cylinder 3 is configured to load a horizontal pressure on the sample 1, and the pressure sensor 4 is configured to monitor a pressure on the sample 1. A stiffness of the frame should meet the requirements of a mechanical test of the solid material on the basis of minimizing the volume and weight of the frame. The hydraulic cylinder 3 provides a loading force, and a type to the hydraulic cylinder 3 is selected according to a requirement for a deformation of the sample 1, so as to provide a different maximum force. In order to reduce a mechanical vibration and electromagnetic interference during the loading process, a manual hydraulic pump 11 is provided to control loading and unloading of the pressure loading device 17 via an oil pipe. Specifically, the manual hydraulic pump 11 controls a piston arranged at a front end of the hydraulic cylinder 3 via the oil pipe. During an oil-filling process, an oil pressure of the hydraulic cylinder 3 is increased, and the piston is pushed out for pressurization; and during an oil-returning process, the oil pressure of the hydraulic cylinder is reduced, and the piston retracts inward for pressure reduction. A pressure sensor 4 is arranged to a bearing block 6 of a passive loading end, so as to monitor a pressure on the sample 1 during the measurement, and the pressure sensor 4 is connected to a digital indicator 12 to display the pressure on the sample 1. In addition, the digital indicator 12 is connected to the computer 13, and the pressure on the sample 1 is displayed, drawn and saved in real time through a software of the computer 13. During the measurement, the sample 1 is placed at the upper end of the microwave dielectric tester 20. The sample 1 under force may have large deformation or macroscopic cracks, consequently, the sample 1 is in poor contact with the upper end of the microwave dielectric tester 20 and the microwave dielectric tester 20 may be damaged due to the excessive compression. Hence, a spring seat 7 embedded with a spring is arranged at a bottom of the microwave dielectric tester 20. The spring seat 7 can passively adjust the contact pressure between the sample 1 and the upper end of the microwave dielectric tester 20 according to the deformation of the sample 1, so that the sample 1 is in stable contact with the upper end of the microwave dielectric tester 20 during the measurement.

In order to reduce a noise interference during the measurement, a shield case 10 for microwave electromagnetic shielding is provided outside the pressure loading device 17. The shield case 10 is a closed structure, and includes a layer of pure aluminum plate 101 and a layer of pyramids made of a microwave absorbing material 102 provided on an inner side of the layer of pure aluminum plate 101. The microwave absorbing material is polyurethane foam. The layer of thin pure aluminum plate 101 is configured to shield an electrical and magnetic interference of the surrounding environment on the system. The layer of pyramids made of the microwave absorbing material 102 with a certain thickness is configured to reduce a multiple reflection of the microwave among the pressure loading device 17, the microwave dielectric tester 20 and the pure aluminum plate 101. In this way, an anechoic chamber is formed inside the shield case 10, so as to provide a stable electromagnetic environment around the sample 1. The shield case 10 is supposed to be a closed structure, but the pressure sensor 4 have to be connected to a connecting wire 16 between the devices, such that a through hole is provided at a bottom of a side of the shield case 10 for the entrance and exit of the connecting wire 16, so as to retain a sealing property of the shield case 10.

Embodiment 1

A rock material was used as a sample 1 for measuring a microwave dielectric property of a solid material under force in Embodiment 1. The measurement was carried out as follows.

Step 1: An open coaxial resonator 2 (Coaxial Prober C) was employed the measurement, which was able to perform a measurement on the sample 1 at 2 GHz, 6 GHz, 10 GHz, 14 GHz and 18 GHz. The signal source of the open coaxial resonator 2 was provided by a vector network analyzer. A microwave dielectric tester 20 including the open coaxial resonator 2 was arranged on a spring seat 7 embedded with a spring.

Step 2: A pressure loading device 17 was designed to match a geometric characteristic of the open coaxial resonator 2 and meet a requirement of a mechanical test. In view of a uniaxial compression deformation of rock materials, a hydraulic cylinder 3 with a maximum pressure of 10 t was fixed to a bearing block 5 of an active loading end. A manual hydraulic pump 11 was provided to control loading and unloading of the pressure loading device 17 via an oil pipe. A pressure sensor 4 was fixed to a bearing block 6 of a passive loading end, and was connected to a digital indicator 12. The digital indicator 12 was connected to a computer 13, so as to display, draw and save a pressure value in real time through a software of the computer 13.

Step 3: A shield case 10 for microwave electromagnetic shielding was provided. The shield case 10 included a layer of pure aluminum plate 101 with a thickness of 1 mm and a layer of pyramids made of a microwave absorbing material 102 with a thickness of 30 mm.

Step 4: Before the measurement, the sample 1 was held between the bearing block 5 of the active loading end and the bearing block 6 of the passive loading end, then was covered by the shield case 10. According to a requirement of the measurement, a single frequency testing mode of 2 GHz was chosen, and a standard polytetrafluoroethylene and a standard silica were used to calibrate the system. A microwave dielectric constant of the sample 1 without an additional force was measured several times. The measured results were recorded to check the repeatability. When a fluctuation amplitude of the last 5 measured values of the microwave dielectric constant was ±0.001, the system was stable enough to start the measurement.

Step 5: The manual hydraulic pump 11 was used for loading force to the sample 1. Upon loading to 1 kN, the measurement for dielectric constant of the sample 1 at 2 GHz was started through the software of the computer 13, and the measurement was performed 5 times in succession. The next level of loading was performed immediately after the measurement was completed.

Step 6: The loading increase in each level was controlled to 1 kN, and step 5 was repeated until the maximum load was reached.

Figure 4:
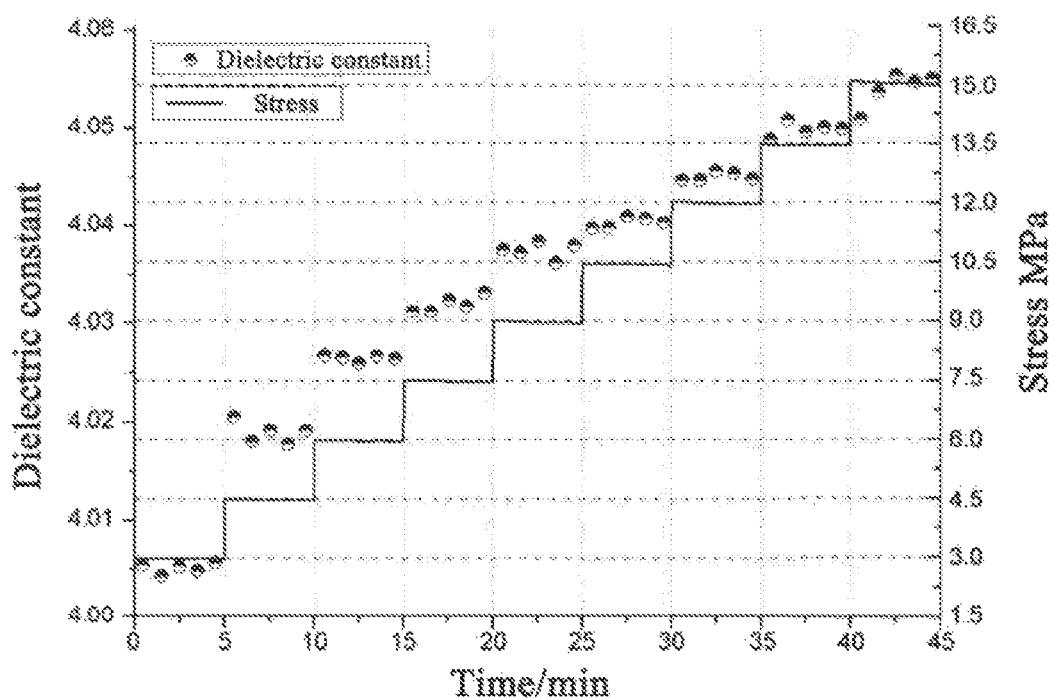
FIG. 4 is a graph showing the measured result of dielectric constant according to an embodiment of the present disclosure.

The dielectric constant changes of the sample 1 under force were shown in FIG. 4.

The objects, technical solutions and beneficial effects of the present invention are described in detail with reference to the above-mentioned embodiments. The embodiments are illustrative of the invention without limiting. Any modifications, replacements and improvements within the spirts of the invention should fall in the protection scope of the present invention.

What is claimed is:

1. A system for measuring a microwave dielectric property of a solid material under force, comprising:
a microwave dielectric tester comprising an open coaxial resonator;
a pressure loading device;
a shield case for microwave electromagnetic shielding;
a spring seat; and
a computer;
wherein the microwave dielectric tester is connected to the spring seat; the pressure loading device is connected to the computer; the microwave dielectric tester and the pressure loading device are arranged inside the shield case, a sample is in contact with an upper portion of the microwave dielectric tester;
the pressure loading device is configured to load a horizontal pressure on the sample of the solid material; the microwave dielectric tester is configured to measure a dielectric constant and a dielectric loss of the sample under the horizontal pressure, and send measured dielectric constant and dielectric loss to the computer; the computer is configured to select a testing mode based on a test demand; the shield case is configured to shield an electromagnetic interference from an external environment; and the spring seat comprises an embedded spring that is attached to a bottom of the microwave dielectric tester, and the spring seat is configured to buffer the microwave dielectric tester against a compression caused by a deformation of the sample.

2. The system of claim 1, wherein the pressure loading device comprises:
a plurality of rods configured for force transfer;
a first rigid bearing plate; and
a second rigid bearing plate;
wherein the first rigid bearing plate and the second rigid bearing plate parallel to each other are vertically arranged; the plurality of rods spaced apart are arranged between the first rigid bearing plate and the second rigid bearing plate to form a frame structure together with the first rigid bearing plate and the second rigid bearing plate;
a hydraulic cylinder is arranged at a side of the first rigid bearing plate facing the second rigid bearing plate; a pressure sensor is arranged at a side of the second bearing plate facing the first second bearing plate; the sample is held between the hydraulic cylinder and the pressure sensor; the hydraulic cylinder is configured to load a horizontal pressure on the sample; and the pressure sensor is configured to monitor a pressure on the sample.

3. The system of claim 2, wherein the pressure loading device further comprises a manual hydraulic pump configured to control loading and unloading of the pressure loading device via an oil pipe.

4. The system of claim 2, wherein the system further comprises a digital indicator configured to receive and display data sent by the pressure sensor, and the pressure sensor is connected to the computer through the digital indicator.

5. The system of claim 1, wherein the shield case is a closed structure, and the shield case comprises a layer of pure aluminum plate and a layer of pyramids made of a microwave absorbing material provided on an inner side of the layer of pure aluminum plate.

* * * * *